United States Patent
Zhao

(10) Patent No.: US 10,464,365 B2
(45) Date of Patent: Nov. 5, 2019

(54) ALIGNMENT FILM PRINTING PLATE AND MANUFACTURING METHOD THEREOF

(71) Applicant: Wuhan China Star Optoelectronics Technology Co., Ltd., Wuhan (CN)

(72) Inventor: Kaixiang Zhao, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 329 days.

(21) Appl. No.: 15/506,245

(22) PCT Filed: Feb. 17, 2017

(86) PCT No.: PCT/CN2017/073959
§ 371 (c)(1),
(2) Date: Feb. 24, 2017

(87) PCT Pub. No.: WO2018/133150
PCT Pub. Date: Jul. 26, 2018

(65) Prior Publication Data
US 2018/0354287 A1 Dec. 13, 2018

(30) Foreign Application Priority Data
Jan. 23, 2017 (CN) .......................... 2017 1 0050277

(51) Int. Cl.
*B41N 1/12* (2006.01)
*G02F 1/1337* (2006.01)
*G03F 7/16* (2006.01)

(52) U.S. Cl.
CPC ............. *B41N 1/12* (2013.01); *G02F 1/1337* (2013.01); *G03F 7/16* (2013.01)

(58) Field of Classification Search
CPC ............ B41N 1/12; G02F 1/1337; G03F 7/16
See application file for complete search history.

(56) References Cited

U.S. PATENT DOCUMENTS

| 4,046,071 A | * | 9/1977 | Mizuno | G03F 7/115 101/395 |
| 4,101,324 A | * | 7/1978 | Mizuno | G03F 7/115 430/262 |
| 4,610,950 A | * | 9/1986 | Milliken | G03F 7/2022 430/306 |

(Continued)

FOREIGN PATENT DOCUMENTS

| CN | 1378917 A | 11/2002 |
| CN | 1495491 A | 5/2004 |

(Continued)

*Primary Examiner* — David H Banh
(74) *Attorney, Agent, or Firm* — Leong C. Lei

(57) ABSTRACT

A method forming an alignment layer for a liquid crystal display device including: attaching a transfer film on a printing roll, the transfer film including a convex portion having first-sized halftone dots and second-sized halftone dots; positioning a substrate on a printing table; providing aligning solution on an anilox roll using a doctor roll; and transferring the aligning solution on the anilox roll to the transfer film while moving the printing table and rotating the printing roll, and then coating the aligning solution on the substrate to thereby form an alignment layer on the substrate.

10 Claims, 3 Drawing Sheets

(56) References Cited

U.S. PATENT DOCUMENTS

| | | | | |
|---|---|---|---|---|
| 5,894,799 A | * | 4/1999 | Bart | B41N 6/00 |
| | | | | 101/376 |
| 2004/0038010 A1 | * | 2/2004 | Kim | G02F 1/133784 |
| | | | | 428/195.1 |
| 2007/0190452 A1 | * | 8/2007 | Kimelblat | B41C 1/05 |
| | | | | 430/270.1 |
| 2008/0206673 A1 | * | 8/2008 | Kawakami | H05K 3/1275 |
| | | | | 430/275.1 |
| 2014/0168596 A1 | * | 6/2014 | Yuge | B41M 1/04 |
| | | | | 349/187 |
| 2014/0363564 A1 | * | 12/2014 | Rule | A61F 13/025 |
| | | | | 427/2.31 |
| 2016/0131973 A1 | * | 5/2016 | Boukaftane | G03F 7/031 |
| | | | | 430/281.1 |

FOREIGN PATENT DOCUMENTS

| | | | |
|---|---|---|---|
| CN | 1514283 | A | 7/2004 |
| CN | 202472187 | U | 10/2012 |
| CN | 103885246 | A | 6/2014 |

* cited by examiner

ALIGNMENT FILM PRINTING PLATE AND MANUFACTURING METHOD THEREOF

BACKGROUND OF THE INVENTION

1. Field of the Invention

The present invention relates to the field of manufacturing of display components, and more particular to an alignment film printing plate and a manufacturing method thereof.

2. The Related Arts

Liquid crystal display (LCD) has various advantages, such as thin device body, low power consumption, and a wide range of applications, and have been widely used, such as liquid crystal televisions, mobile phones, personal digital assistants (PDAs), digital cameras, computer screens, and notebook computer screens.

Most of the liquid crystal display devices that are currently available in the market are backlighting LCDs, which comprise an enclosure, a liquid crystal panel arranged in the enclosure, and a backlight module arranged in the enclosure.

The structure of the liquid crystal panel generally comprises a color filter (CF) substrate, a thin film transistor (TFT) array substrate, and a liquid crystal layer interposed between the two substrates and the working principle is that a driving voltage is applied to the two glass substrates to control rotation of the liquid crystal molecules of the liquid crystal layer for refracting out light emitting from the backlight module to generate an image.

To make the liquid crystal molecules aligned in a more regular way, a polyimide (PI) alignment film is coated on each of sides of the array substrate and the CF substrate adjacent to the liquid crystal layer. The interaction between side-chain groups of the PI alignment film and the liquid crystal molecules is much more powerful and may provide an anchoring effect on the liquid crystal molecules, making the liquid crystal molecules lining up in orientation at a predetermined polar angle that is inclined with respect to a surface of the PI alignment film, and such a polar angle is referred to as a pre-tilt angle. The pre-tilt angle controls the direction of the liquid crystal molecules, prevents the occurrence of reversely tilting domains, and affect, to some extents, the light transmission rate-voltage curve of the liquid crystal layer. A suitable pre-tilt angle may lower down threshold voltage and making the response speed of liquid crystal fast.

Heretofore, there are generally two ways, which are inkjet and print, used to coat an alignment film on an array substrate or a CF substrate, and the primary tool involved in the printing way is a printing plate. Referring simultaneously to FIGS. 1 and 2, a known alignment film printing plate comprises backing protection layer 100 and a bottom sheet 200 stacked on the backing protection layer 100. The bottom sheet 200 comprises, uniformly distributed therein, a plurality of circular bumps 201 that are of the same diameter and have a relatively large size. Liquid PI can be received between the circular bumps 201 and in printing, the liquid PI between the circular bumps 201 is compelled to a substrate. Since the circular bumps 201 on every portion of the bottom sheet 200 are all relatively large, multiple ones of the circular bumps 201 that are located on edges of the bottom sheet 200 may hold a relatively large quantity of the liquid PI material therebetween, leading to hard control of accuracy at a boundary 500 of the PI alignment film in a printing operation. The boundary 500 of the PI alignment film may get curving up and down, following the circular bumps, making it adverse to improvement of printing accuracy.

SUMMARY OF THE INVENTION

An objective of the present invention is to provide an alignment film printing plate, which, when used to carry out printing on an alignment film, helps improve printing accuracy of a boundary area of the alignment film.

Another objective of the present invention is to provide a manufacturing method of an alignment film printing plate so that the alignment film printing plate so manufactured, when used to carry out printing on an alignment film, helps improve printing accuracy of a boundary area of the alignment film.

To achieve the above objectives, the present invention provides an alignment film printing plate, which comprises a backing protection layer and a bottom sheet stacked on the backing protection layer, the bottom sheet comprising a plurality of first circular bumps formed on and distributed on a circumferential edge portion thereof and a plurality of second circular bumps formed on and distributed in a central portion of the bottom sheet and circumferentially surrounded by the plurality of first circular bumps, the first circular bumps having a diameter that is smaller than a diameter of the second circular bumps.

The backing protection layer has a material comprising polyethylene terephthalate.

The bottom sheet has a material comprising an organic photoresist.

The diameter of the first circular bumps is ⅓ or ¼ of the diameter of the second circular bumps.

The present invention also provides a manufacturing method of an alignment film printing plate, which comprises the following steps:

Step S1: providing a backing protection layer; and

Step S2: coating an organic photoresist material on the backing protection layer and using a mask to subject the organic photoresist material so coated to exposure and development, and afterwards, subjecting the organic photoresist material to curing treatment so as to form a bottom sheet stacked on the backing protection layer;

wherein the bottom sheet comprises a plurality of first circular bumps formed on and distributed on a circumferential edge portion thereof and a plurality of second circular bumps formed on and distributed in a central portion of the bottom sheet and circumferentially surrounded by the plurality of first circular bumps and the first circular bumps have a diameter that is smaller than a diameter of the second circular bumps.

In Step S2, curing is applied to subject the organic photoresist material to the curing treatment.

The backing protection layer has a material comprising polyethylene terephthalate.

The diameter of the first circular bumps is ⅓ or ¼ of the diameter of the second circular bumps.

The present invention further provides an alignment film printing plate, which comprises a backing protection layer and a bottom sheet stacked on the backing protection layer, the bottom sheet comprising a plurality of first circular bumps formed on and distributed on a circumferential edge portion thereof and a plurality of second circular bumps formed on and distributed in a central portion of the bottom sheet and circumferentially surrounded by the plurality of first circular bumps, the first circular bumps having a diameter that is smaller than a diameter of the second circular bumps;

wherein the backing protection layer has a material comprising polyethylene terephthalate; and wherein the bottom sheet has a material comprising an organic photoresist.

The efficacy of the present invention is that the present invention provides an alignment film printing plate, which comprises a plurality of first circular bumps arranged on a circumferential edge portion of a bottom sheet and a plurality of second circular bumps arranged on a central portion of the bottom sheet and surrounded by the plurality of first circular bumps, with a diameter of the first circular bumps being smaller than a diameter of the second circular bumps, so that when the alignment film printing plate is used to carry out a printing operation on the alignment film, a quantity of a portion of the liquid alignment material received and held between the first circular bumps on the edge portion of the bottom sheet is relatively small so that irregular splashing of the liquid alignment material occurring on a boundary area of the alignment film can be reduced and thus, printing accuracy of the boundary area of the alignment film can be improved. The present invention provides a manufacturing method of an alignment film printing plate, which makes a printing plate that comprises a plurality of first circular bumps formed on and distributed in a circumferential edge portion of a bottom sheet and a plurality of second circular bumps formed on and distributed in a central portion of the bottom sheet and surrounded by the plurality of first circular bumps, wherein a diameter of the first circular bumps is smaller than a diameter of the second circular bumps and is applicable to printing of an alignment film to help improve printing accuracy of a boundary area of the alignment film.

BRIEF DESCRIPTION OF THE DRAWINGS

For better understanding of the features and technical contents of the present invention, reference will be made to the following detailed description of the present invention and the attached drawings. However, the drawings are provided only for reference and illustration and are not intended to limit the present invention.

In the drawings.

DETAILED DESCRIPTION OF THE PREFERRED EMBODIMENTS

To further expound the technical solution adopted in the present invention and the advantages thereof, a detailed description will be given with reference to the preferred embodiments of the present invention and the drawings thereof.

Figure 1:
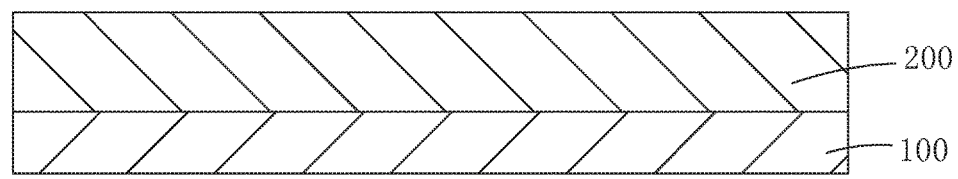
FIG. 1 is a schematic view illustrating a cross-sectional structure of a conventional alignment film printing plate.
Figure 2:
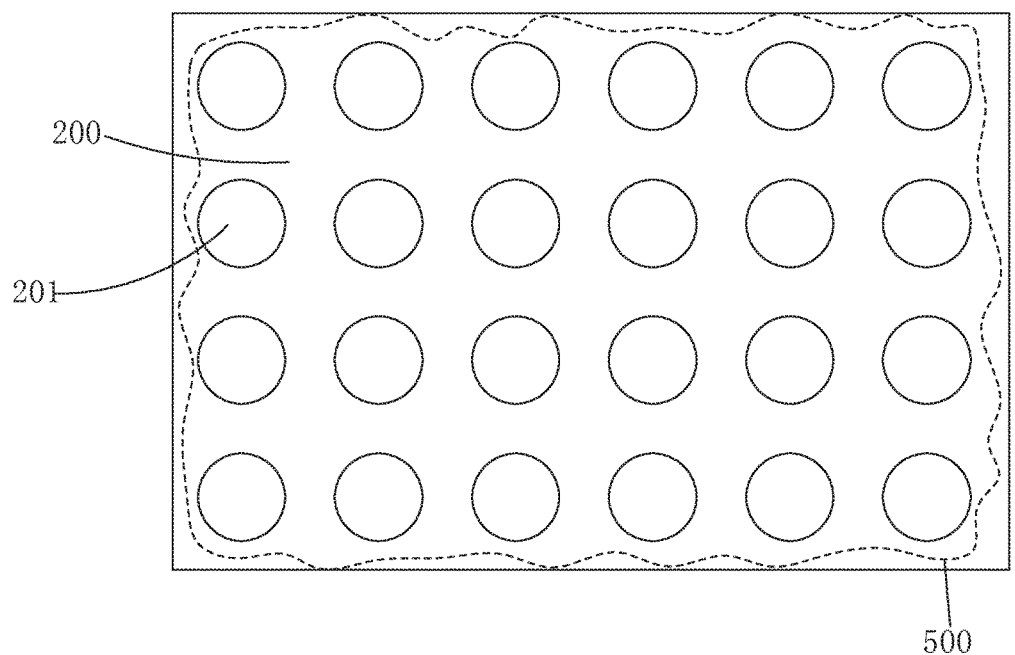
FIG. 2 is a schematic top plan view illustrating the conventional alignment film printing plate.
Figure 3:
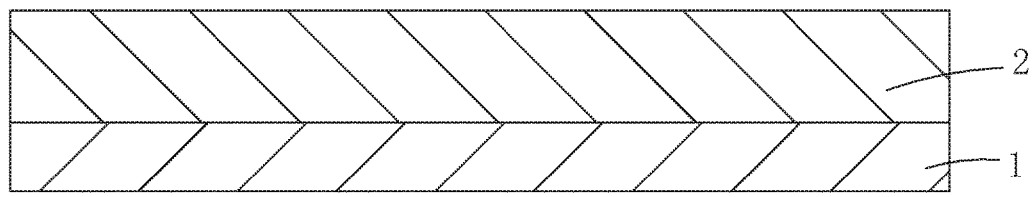
FIG. 3 is a schematic view illustrating a cross-sectional structure of an alignment film printing plate according to the present invention.
Figure 4:
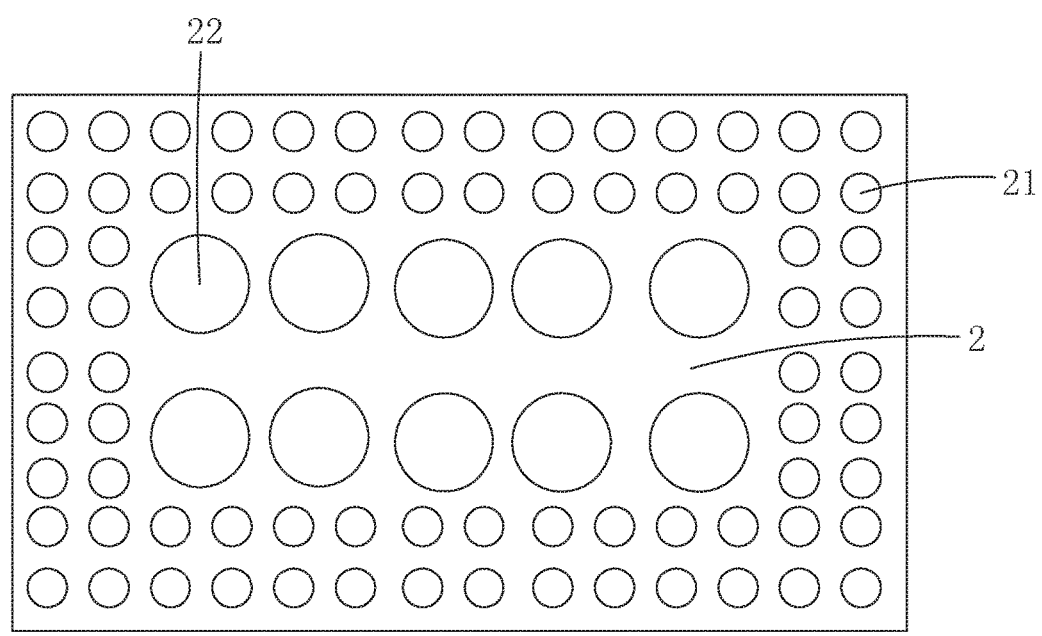
FIG. 4 is a schematic top plan view illustrating the alignment film printing plate according to the present invention.

Referring collectively to FIGS. 3 and 4, firstly, the present invention provides an alignment film printing plate, which comprises a backing protection layer 1 and a bottom sheet 2 stacked on the backing protection layer 1. The bottom sheet 2 comprises a plurality of first circular bumps 21 formed on and distributed on a circumferential edge portion thereof and a plurality of second circular bumps 22 formed on and distributed in a central portion of the bottom sheet 2 and circumferentially surrounded by the plurality of first circular bumps 21. The first circular bumps 21 have a diameter that is smaller than a diameter of the second circular bumps 22.

Compared to a conventional alignment film printing plate that comprises a plurality of circular bumps uniformly distributed on a bottom sheet and having the same diameter and a relatively large size, the alignment film printing plate according to the present invention comprises a plurality of first circular bumps 21 that have a small diameter arranged on an edge portion of the bottom sheet 2 so that when the alignment film printing plate of the present invention is used to carry out a printing operation on the alignment film, a liquid alignment material can be received and held between first circular bumps 21, between second circular bumps 22, and between the first circular bumps 21 and the second circular bumps 22 of the bottom sheet 2; when a substrate-to-be-printed is brought into contact with the bottom sheet 2, being acted upon by pressure so induced, the liquid alignment material received in the spaces between first circular bumps 21, those between second circular bumps 22, and those between the first circular bumps 21 and the second circular bumps 22 is squeezed and compelled onto the substrate-to-be-printed to complete the printing of the alignment film. A portion of the liquid alignment material that is received between the first circular bumps 21 that are located on the circumferential edge portion of the bottom sheet 2 corresponds to a boundary area of the alignment film, while portions of liquid alignment material received between the second circular bumps 22 and between the first circular bumps 21 and the second circular bumps 22 correspond to areas of the alignment film that are other than the boundary area. Since the first circular bumps 21 has a small diameter, the portion of liquid alignment material that is received and held between the first circular bumps 21 has a relatively small quantity so that irregular splashing of liquid alignment material occurring on the boundary area of the alignment film can be reduced to thereby improve printing accuracy on the boundary area of the alignment film.

Specifically, the smaller the diameter of the first circular bumps 21 is, the better the control of the printing accuracy on the boundary area of the alignment film would be. However, in consideration of feasibly concerning cost, the diameter of the first circular bumps 21 is preferably set to one third (⅓) or a quarter (¼) of the diameter of the second circular bumps 22.

Specifically, the backing protection layer 1 has a material comprising polyethylene terephthalate (PET).

Specifically, the bottom sheet 2 has a material comprising an organic photoresist.

Figure 5:
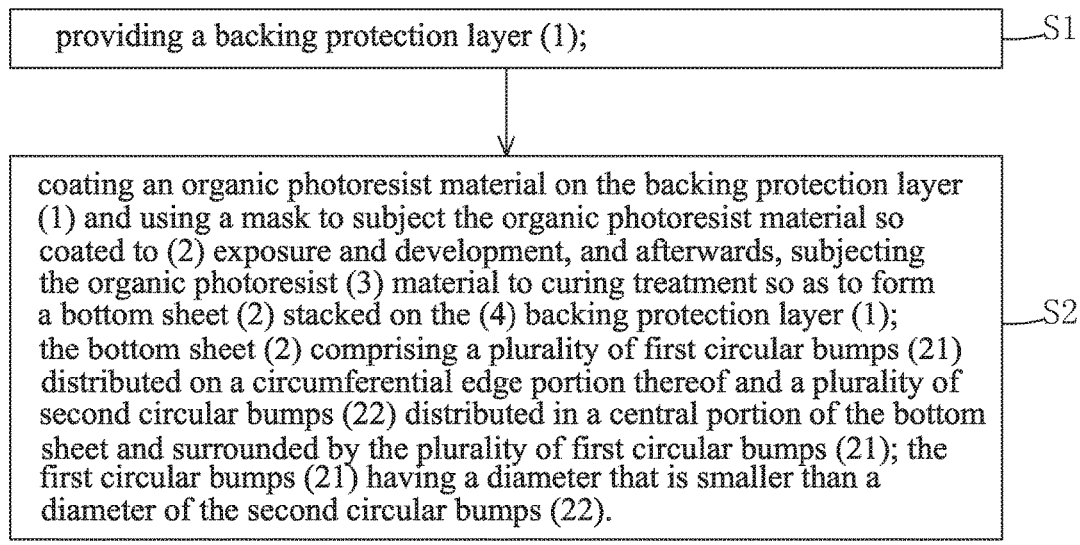
FIG. 5 is a flow chart illustrating a manufacturing method of an alignment film printing plate according to the present invention.

Referring to FIG. 5, in combination with FIGS. 3 and 4, the present invention also provides a manufacturing method of an alignment film printing plate, which comprises the following steps:

Step S1: providing a backing protection layer 1.

Specifically, the backing protection layer 1 has a material comprising PET.

Step S2: coating an organic photoresist material on the backing protection layer 1 and using a mask (not shown in the drawings) to subject the organic photoresist material so coated to exposure and development, and afterwards, applying baking or other curing means to subject the organic photoresist material to curing treatment so as to form a bottom sheet 2 stacked on the backing protection layer 1.

Specifically, the bottom sheet 2 so formed with the mask comprises a plurality of first circular bumps 21 formed on and distributed on a circumferential edge portion thereof and a plurality of second circular bumps 22 formed on and distributed in a central portion of the bottom sheet and circumferentially surrounded by the plurality of first circular bumps 21. The first circular bumps 21 have a diameter that is smaller than a diameter of the second circular bumps 22. Preferably, the diameter of the first circular bumps 21 is ⅓ or ¼ of the diameter of the second circular bumps 2.

When the alignment film printing plate manufactured with the above method is used to carry out a printing operation on an alignment film, a liquid alignment material can be received and held between first circular bumps 21, between second circular bumps 22, and between the first circular bumps 21 and the second circular bumps 22 of the bottom sheet 2; when a substrate-to-be-printed is brought into contact with the bottom sheet 2, being acted upon by pressure so induced, the liquid alignment material received in the spaces between first circular bumps 21, those between second circular bumps 22, and those between the first circular bumps 21 and the second circular bumps 22 is squeezed and compelled onto the substrate-to-be-printed to complete the printing of the alignment film. A portion of the liquid alignment material that is received between the first circular bumps 21 that are located on the circumferential edge portion of the bottom sheet 2 corresponds to a boundary area of the alignment film, while portions of liquid alignment material received between the second circular bumps 22 and between the first circular bumps 21 and the second circular bumps 22 correspond to areas of the alignment film that are other than the boundary area. Since the first circular bumps 21 has a small diameter, the portion of liquid alignment material that is received and held between the first circular bumps 21 has a relatively small quantity so that irregular splashing of liquid alignment material occurring on the boundary area of the alignment film can be reduced to thereby improve printing accuracy on the boundary area of the alignment film.

In summary, the present invention provides an alignment film printing plate, which comprises a plurality of first circular bumps arranged on a circumferential edge portion of a bottom sheet and a plurality of second circular bumps arranged on a central portion of the bottom sheet and surrounded by the plurality of first circular bumps, with a diameter of the first circular bumps being smaller than a diameter of the second circular bumps, so that when the alignment film printing plate is used to carry out a printing operation on the alignment film, a quantity of a portion of the liquid alignment material received and held between the first circular bumps on the edge portion of the bottom sheet is relatively small so that irregular splashing of the liquid alignment material occurring on a boundary area of the alignment film can be reduced and thus, printing accuracy of the boundary area of the alignment film can be improved. The present invention provides a manufacturing method of an alignment film printing plate, which makes a printing plate that comprises a plurality of first circular bumps formed on and distributed in a circumferential edge portion of a bottom sheet and a plurality of second circular bumps formed on and distributed in a central portion of the bottom sheet and surrounded by the plurality of first circular bumps, wherein a diameter of the first circular bumps is smaller than a diameter of the second circular bumps and is applicable to printing of an alignment film to help improve printing accuracy of a boundary area of the alignment film.

Based on the description given above, those having ordinary skills in the art may easily contemplate various changes and modifications of he technical solution and the technical ideas of the present invention. All these changes and modifications are considered belonging to the protection scope of the present invention as defined in the appended claims.

What is claimed is:

1. An alignment film printing plate, comprising a backing protection layer and a bottom sheet stacked on the backing protection layer, the bottom sheet comprising a plurality of first circular bumps formed on and distributed on a circumferential edge portion thereof and a plurality of second circular bumps formed on and distributed in a central portion of the bottom sheet and circumferentially surrounded by the plurality of first circular bumps, the first circular bumps having a diameter that is smaller than a diameter of the second circular bumps;

wherein the plurality of first circular bumps distributed on the circumferential edge portion of the bottom sheet are spaced from each other by a first spacing distance and the plurality of second circular bumps distributed on the central portion of the bottom sheet are spaced from each other by a second spacing distance, the second spacing distance being greater than the first spacing distance.

2. The alignment film printing plate as claimed in claim 1, wherein the backing protection layer has a material comprising polyethylene terephthalate.

3. The alignment film printing plate as claimed in claim 1, wherein the bottom sheet has a material comprising an organic photoresist.

4. The alignment film printing plate as claimed in claim 1, wherein the diameter of the first circular bumps is ⅓ or ¼ of the diameter of the second circular bumps.

5. A manufacturing method of an alignment film printing plate, comprising the following steps:

Step S1: providing a backing protection layer; and

Step S2: coating an organic photoresist material on the backing protection layer and using a mask to subject the organic photoresist material so coated to exposure and development, and afterwards, subjecting the organic photoresist material to curing treatment so as to form a bottom sheet stacked on the backing protection layer;

wherein the bottom sheet comprises a plurality of first circular bumps formed on and distributed on a circumferential edge portion thereof and a plurality of second circular bumps formed on and distributed in a central portion of the bottom sheet and circumferentially surrounded by the plurality of first circular bumps and the first circular bumps have a diameter that is smaller than a diameter of the second circular bumps; and wherein the plurality of first circular bumps distributed on the circumferential edge portion of the bottom sheet are spaced from each other by a first spacing distance and the plurality of second circular bumps distributed on the central portion of the bottom sheet are spaced from each other by a second spacing distance, the second spacing distance being greater than the first spacing distance.

6. The manufacturing method of the alignment film printing plate as claimed in claim 5, wherein in Step S2, curing is applied to subject the organic photoresist material to the curing treatment.

7. The manufacturing method of the alignment film printing plate as claimed in claim 5, wherein the backing protection layer has a material comprising polyethylene terephthalate.

8. The manufacturing method of the alignment film printing plate as claimed in claim 5, wherein the diameter of the first circular bumps is ⅓ or ¼ of the diameter of the second circular bumps.

9. An alignment film printing plate, comprising a backing protection layer and a bottom sheet stacked on the backing protection layer, the bottom sheet comprising a plurality of first circular bumps formed on and distributed on a circumferential edge portion thereof and a plurality of second circular bumps formed on and distributed in a central portion of the bottom sheet and circumferentially surrounded by the plurality of first circular bumps, the first circular bumps having a diameter that is smaller than a diameter of the second circular bumps;

wherein the plurality of first circular bumps distributed on the circumferential edge portion of the bottom sheet are spaced from each other by a first spacing distance and the plurality of second circular bumps distributed on the central portion of the bottom sheet are spaced from each other by a second spacing distance, the second spacing distance being greater than the first spacing distance;

wherein the backing protection layer has a material comprising polyethylene terephthalate; and wherein the bottom sheet has a material comprising an organic photoresist.

10. The alignment film printing plate as claimed in claim 9, wherein the diameter of the first circular bumps is ⅓ or ¼ of the diameter of the second circular bumps.

* * * * *